United States Patent
Song et al.

(10) Patent No.: US 7,633,096 B2
(45) Date of Patent: Dec. 15, 2009

(54) SILICON-CONTROLLED RECTIFIER FOR ELECTROSTATIC DISCHARGE PROTECTION CIRCUITS AND STRUCTURE THEREOF

(75) Inventors: Ki-Whan Song, Seoul (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 547 days.

(21) Appl. No.: 11/461,681

(22) Filed: Aug. 1, 2006

(65) Prior Publication Data

US 2007/0034896 A1    Feb. 15, 2007

(30) Foreign Application Priority Data

Aug. 10, 2005    (KR) .................... 10-2005-0073053

(51) Int. Cl.
*H01L 23/62*    (2006.01)
(52) U.S. Cl. ................ 257/173; 257/355; 257/E29.181
(58) Field of Classification Search .................. 257/173, 257/E29.181
See application file for complete search history.

(56) References Cited

U.S. PATENT DOCUMENTS

| | | | | |
|---|---|---|---|---|
| 5,532,896 A | * | 7/1996 | Coussens et al. ............... | 361/56 |
| 5,663,860 A | * | 9/1997 | Swonger ...................... | 361/56 |
| 6,016,002 A | * | 1/2000 | Chen et al. .................... | 257/546 |
| 6,476,422 B1 | | 11/2002 | Yu | |
| 2004/0084730 A1 | | 5/2004 | Morishita | |

FOREIGN PATENT DOCUMENTS

| | | |
|---|---|---|
| CN | 1638113 | 7/2005 |
| KR | 1997-005243 | 2/1997 |
| KR | 2002-0015199 | 2/2002 |
| KR | 2002-0054862 | 7/2002 |
| KR | 2006-0077754 | 7/2006 |
| WO | WO 03/005523 | 1/2003 |

OTHER PUBLICATIONS

English language abstract of Korean Publication No. 2002-0015199.
English language abstract of Korean Publication No. 2002-0054862.

* cited by examiner

*Primary Examiner*—Thao X Le
*Assistant Examiner*—Ajay K Arora
(74) *Attorney, Agent, or Firm*—Volentine & Whitt, PLLC (57) ABSTRACT

A Silicon-Controlled Rectifier (SCR) for Electrostatic Discharge (ESD) protection includes an isolation device. The isolation device isolates a main ground voltage line, connected to a first cathode, from a peripheral ground voltage line, connected to a second cathode. As result, even when noise occurs in the peripheral ground voltage line during the operation of an integrated circuit, the main ground voltage line maintains a stable voltage level.

19 Claims, 6 Drawing Sheets

SILICON-CONTROLLED RECTIFIER FOR ELECTROSTATIC DISCHARGE PROTECTION CIRCUITS AND STRUCTURE THEREOF

CROSS REFERENCE TO RELATED APPLICATION

This application claims priority under 35 U.S.C. § 119 to Korean Patent Application No. 2005-73053, filed on Aug. 10, 2005, the contents of which are herein incorporated by reference in its entirety for all purposes.

BACKGROUND OF THE INVENTION

1. Field of the Invention

The present invention relates to integrated circuits and, more particularly, to an electrostatic discharge protection circuit with silicon-controlled rectifier characteristics for protecting integrated circuits from being damaged by electrostatic discharge.

2. Description of the Related Art

Integrated circuits (ICs) frequently break down when a high voltage is applied. Such high voltages may be generated as a result of static electricity or the like. Therefore, in ICs, an Electrostatic Discharge (ESD) protection circuit is generally provided to protect internal circuits from potential damage caused by external static electricity. IC design has been steadily reducing power consumption as well as the area occupied by the circuit. In such circuits it is known to provide ESD protection using a silicon-controlled rectifier (SCR) as shown in FIG. 1.

Figure 1:
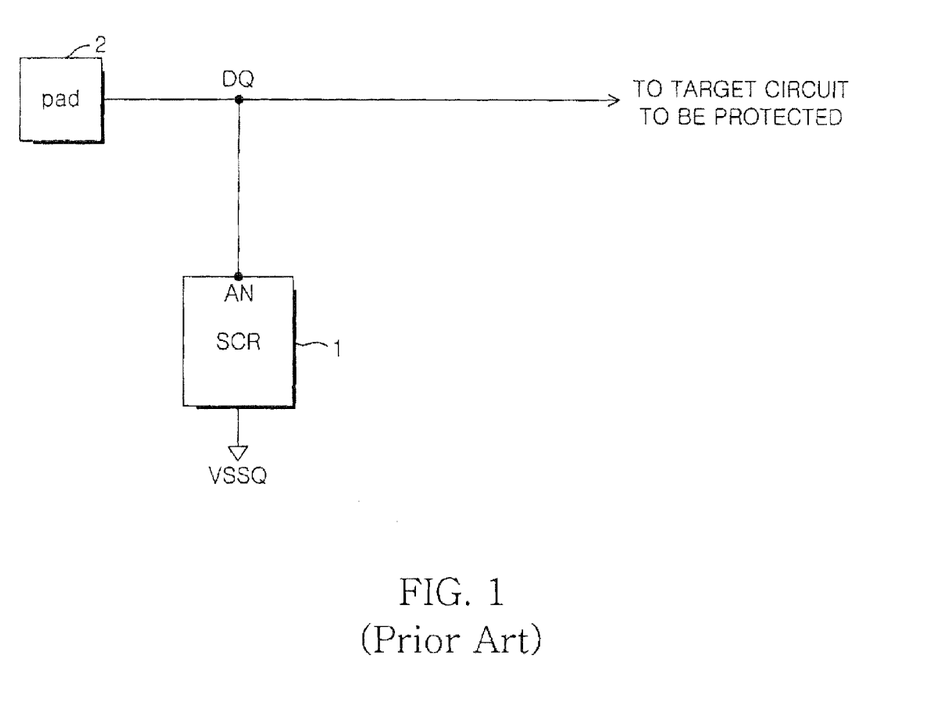
FIG. 1 is a diagram of a prior art ESD protection circuit using a typical silicon-controlled rectifier.

With reference to FIG. 1, an SCR 1 is used as an ESD protection circuit. An anode AN of SCR 1 is connected to a signal line DQ, which in turn is connected to an IC (not shown). If an overvoltage caused by ESD appears on signal line DQ, SCR 1 allows current to flow into a peripheral ground voltage line VSSQ. As a result, the IC is protected from shocks caused by ESD.

Figure 2:
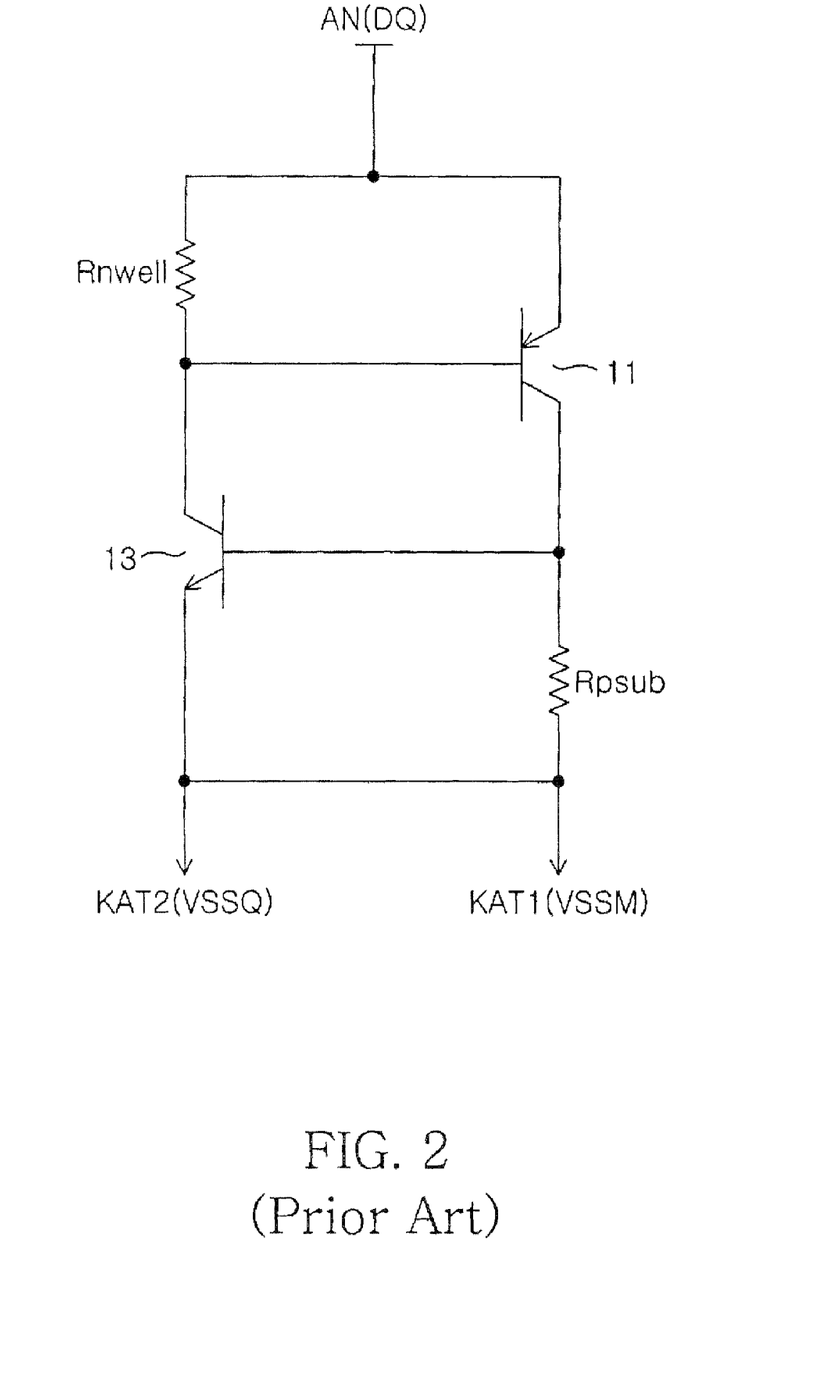
FIG. 2 is a circuit diagram of a conventional silicon-controlled rectifier for ESD protection circuits.
Figure 3:
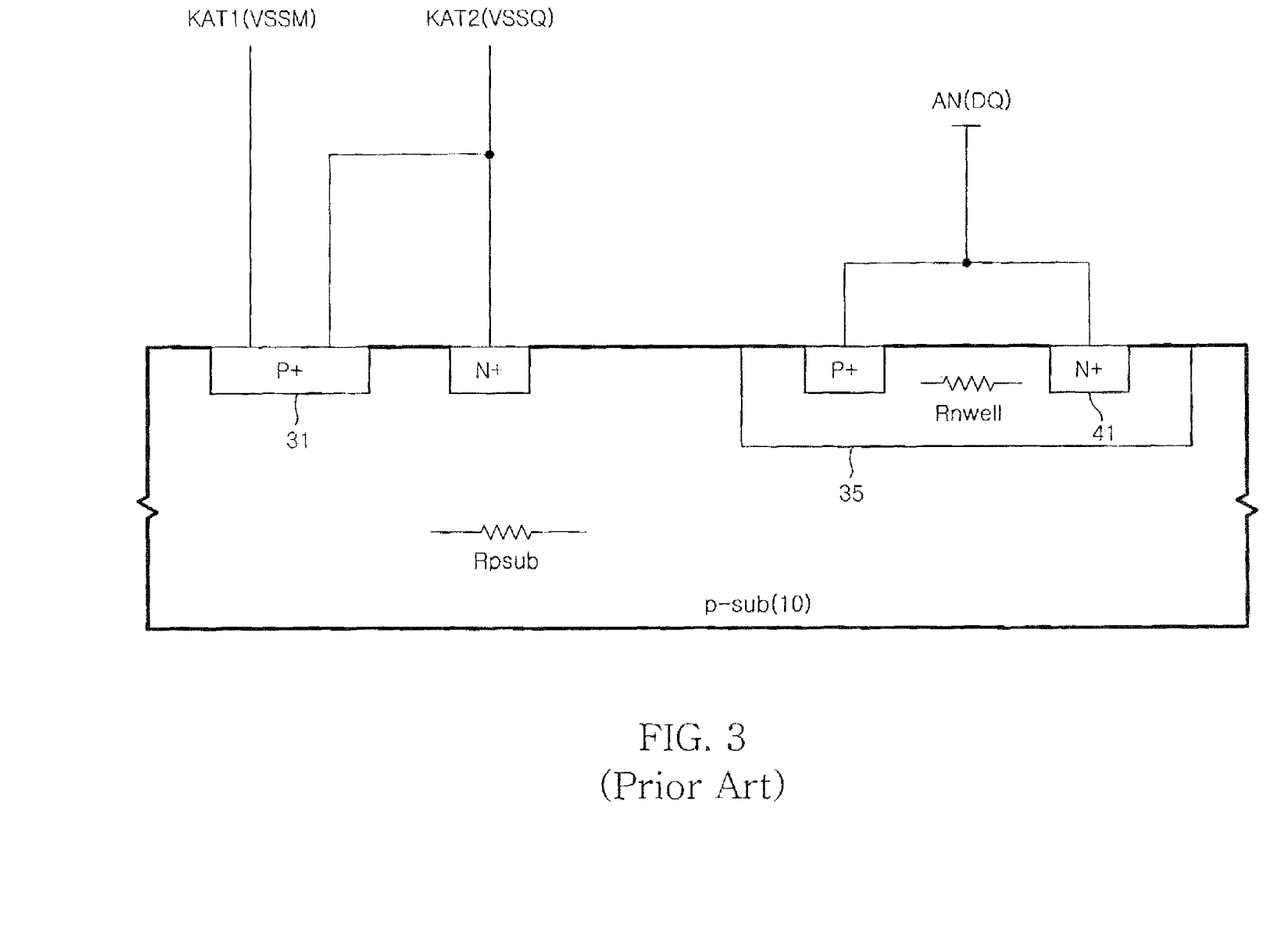
FIG. 3 is a sectional view showing the structure of the silicon-controlled rectifier of FIG. 2.

FIG. 2 is a circuit diagram of a conventional SCR for ESD protection circuits, like SCR 1 in FIG. 1. FIG. 3 is a sectional view showing the structure of the SCR of FIG. 2. Referring to FIG. 2, if a high voltage on a signal line DQ is applied to the anode AN of the SCR, the voltage of the anode AN may increase to a trigger voltage or higher. In this case, a PNP transistor 11 turns on, and an NPN transistor 13, the base of which is connected to the collector of the PNP transistor 11, also turns on. As a result, current flows from the anode AN into a first cathode KAT1 and a second cathode KAT2. In FIG. 2, the first cathode KAT1 is connected to a main ground voltage line VSSM, and the second cathode KAT2 is connected to a peripheral ground voltage line VSSQ.

However, in the structure of the conventional SCR, the main ground voltage line VSSM is substantially connected to the peripheral ground voltage line VSSQ, as shown in FIG. 3. That is, the main ground voltage line VSSM and the peripheral ground voltage line VSSQ are connected to the same P+ region 31. This creates a problem in that the voltage of the main ground voltage line VSSM, which requires high stability, may become unstable due to the voltage of the peripheral ground voltage line VSSQ, which is influenced by noise during the operation of the IC.

For reference, in FIGS. 2 and 3, reference character Rpsub is indicated by modeling a resistance element existing between an N-well 35 and a P+ region 31. Reference character Rnwell is indicated by modeling a resistance element existing in the N-well 35 between an N+ region 41 and a P-type substrate 10.

SUMMARY OF THE INVENTION

Accordingly, the present invention has been made keeping in mind the above problems occurring in the prior art, and an object of the present invention is to provide an ESD protection circuit with silicon-controlled rectifier characteristics in which a main ground voltage line is substantially isolated from a peripheral ground voltage line, thus stably supplying a main ground voltage during the operation of an IC.

In accordance with one aspect of the present invention, there is provided an ESD protection circuit with silicon-controlled rectifier characteristics for preventing an overvoltage from being applied to an IC. The silicon-controlled rectifier of the present invention comprises an anode connected to the IC; a first cathode connected to a main ground line; a second cathode connected to a peripheral ground line; a PNP transistor disposed between the anode and the first cathode; an NPN transistor disposed between the anode and the second cathode; and an isolation device for electrically isolating the first cathode from the second cathode.

DESCRIPTION OF THE PREFERRED EMBODIMENTS

The above and other objects, features and other advantages of the present invention will be more clearly understood from the following detailed description taken in conjunction with the accompanying drawings. Preferred embodiments of the present invention are described with reference to the attached drawings. In the following description of the present invention, detailed descriptions may be omitted if they are constructed and function in a known manner.

In the present specification, voltage lines for supplying a ground voltage VSS are classified into a peripheral ground voltage line VSSQ and a main ground voltage line VSSM. In this case, the peripheral ground voltage line VSSQ mainly connects the ground voltage VSS to peripheral circuits, including an input/output circuit for driving a large amount of current that causes a large amount of noise in an IC. The main ground voltage line VSSM mainly connects the ground voltage VSS to a core part of the IC. As a result, the voltage of the peripheral ground voltage line VSSQ is subject to a large amount of noise during the operation of the IC. But the voltage of the main ground voltage line VSSM requires higher stability than VSSQ. Accordingly, in various ICs, including Dynamic Random Access Memory (DRAM), a triple well manufacturing process in which a pocket N-well isolates a P-well region, to which the peripheral ground voltage is applied, from a P-well region, to which the main ground voltage is applied.

Hereinafter, the present invention is described in detail by describing the preferred embodiments of the present invention with reference to the accompanying drawings.

A Silicon-Controlled Rectifier (SCR) of the present invention can be used in an ESD protection circuit to prevent an overvoltage from being applied to a target circuit on a signal line DQ, as described above with reference to FIG. 1.

Figure 4:
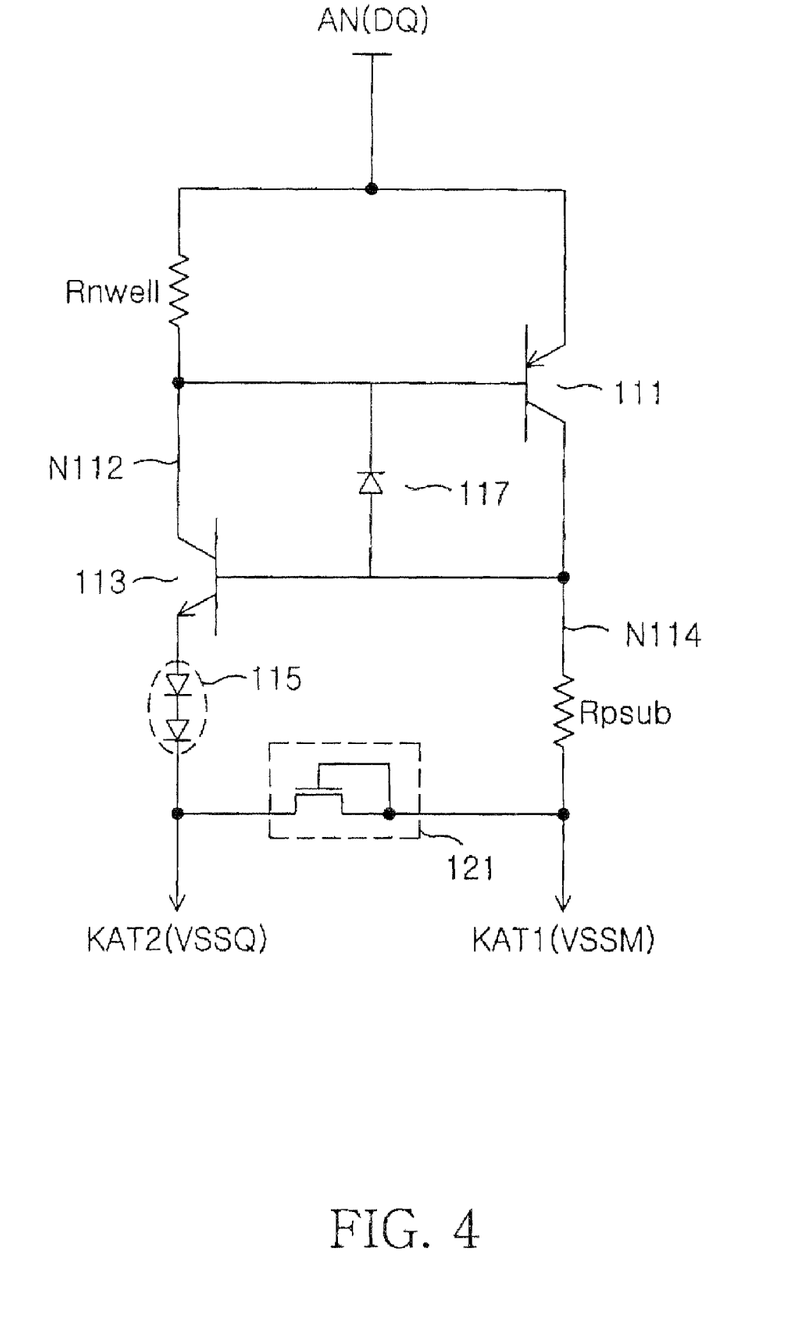
FIG. 4 is a circuit diagram of a silicon-controlled rectifier for ESD protection circuits according to an embodiment of the present invention.

FIG. 4 is a circuit diagram of an ESD protection circuit according to an embodiment of the present invention. Referring to FIG. 4, the SCR of the present invention includes an anode AN, a first cathode KAT1, a second cathode KAT2, a PNP transistor 111, an NPN transistor 113, and an isolation device 121.

The anode AN is connected to a signal line DQ, which in turn is connected to an IC. Further, the first cathode KAT1 and the second cathode KAT2 are connected to a main ground voltage line VSSM and a peripheral ground voltage line VSSQ, respectively.

The PNP transistor 111 is disposed between the anode AN and the first cathode KAT1, and the NPN transistor 113 is disposed between the anode AN and the second cathode KAT2. The base of the PNP transistor 111 and the collector of the NPN transistor 113 are connected in common to a node N112. The base of the NPN transistor 113 and the collector of the PNP transistor 111 are connected in common to a node N114.

Figure 5:
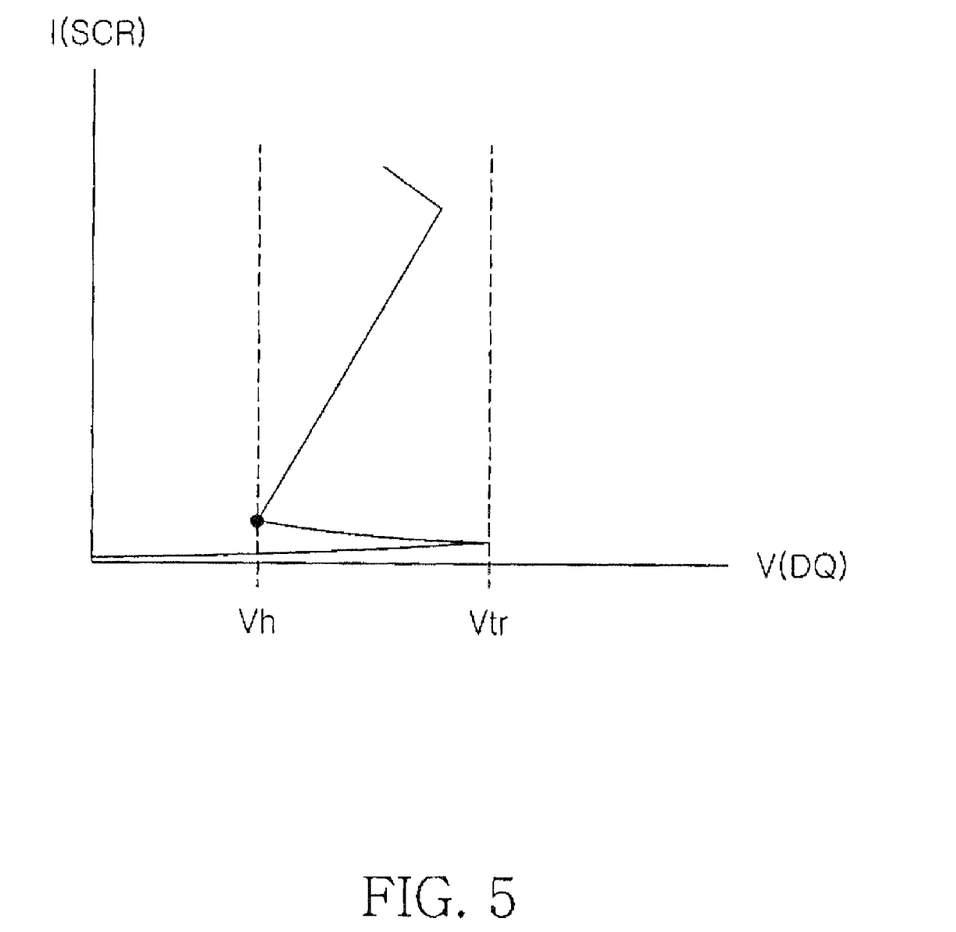
FIG. 5 is a view showing the operation of a silicon-controlled rectifier.

As a result, as shown in FIG. 5, the PNP transistor 111 and the NPN transistor 113 are latched to each other if the voltage of the anode AN increases to a trigger voltage Vtr or higher. In contrast, if the voltage of the anode AN decreases to a predetermined holding voltage Vh or lower, the latched status is released.

The isolation device 121 electrically isolates the first cathode KAT1 from the second cathode KAT2. Preferably, the isolation device 121 is implemented with an N-channel transistor 121, one junction and a gate terminal of which are connected to the first cathode KAT1, and the other junction of which is connected to the second cathode KAT2.

When the difference between the voltage of the second cathode KAT2 and the voltage of the first cathode KAT1 is within the threshold voltage of the N-channel transistor 121, the first cathode KAT1 and the second cathode KAT2 are electrically isolated from each other. In other words, when the difference between the voltage of the peripheral ground voltage line VSSQ and the voltage of the main ground voltage line VSSM is within the threshold voltage of the N-channel transistor 121, the main ground voltage line VSSM is electrically isolated from the peripheral ground voltage line VSSQ.

Therefore, in the circuit of the present invention, even if noise occurs in the peripheral ground voltage line VSSQ during the operation of the IC, the main ground voltage line VSSM maintains a stable voltage level.

Further, due to isolation device 121, the voltage of the second cathode KAT2 is prevented from becoming higher than the voltage of the first cathode KAT1 by the threshold voltage of the N-channel transistor 121.

Preferably, the circuit of the present invention further includes a diode stack unit 115 disposed between the second cathode KAT2 and the emitter of the NPN transistor 113. The diode stack unit 115 is implemented in such a way that one or more diodes, whichever number is suitable, are connected to each other. Because a voltage drop of about 0.7V occurs across each diode, the voltage applied between the emitter and the collector of the NPN transistor 113 during normal operation can be set, by selecting the number of diodes, to a voltage lower than the holding voltage Vh of FIG. 5.

Preferably, the SCR of the present invention further includes a diode 117 having a low breakdown voltage for low voltage triggering. Preferably, the diode 117 may be implemented in the form of a P-N junction for avalanche breakdown or a zener diode. In this case, the P-N junction for avalanche breakdown can be easily implemented by the junction between the source of an NMOS transistor and the P-channel for punch-through prevention of an NMOS transistor. Further, the zener diode 117 can be implemented by forming N+/P+ junction through a separate manufacturing process to produce a very low breakdown voltage. Therefore, when ESD occurs, the zener diode 117 operates to increase current flowing through the PNP transistor 111 and the NPN transistor 113.

Figure 6:
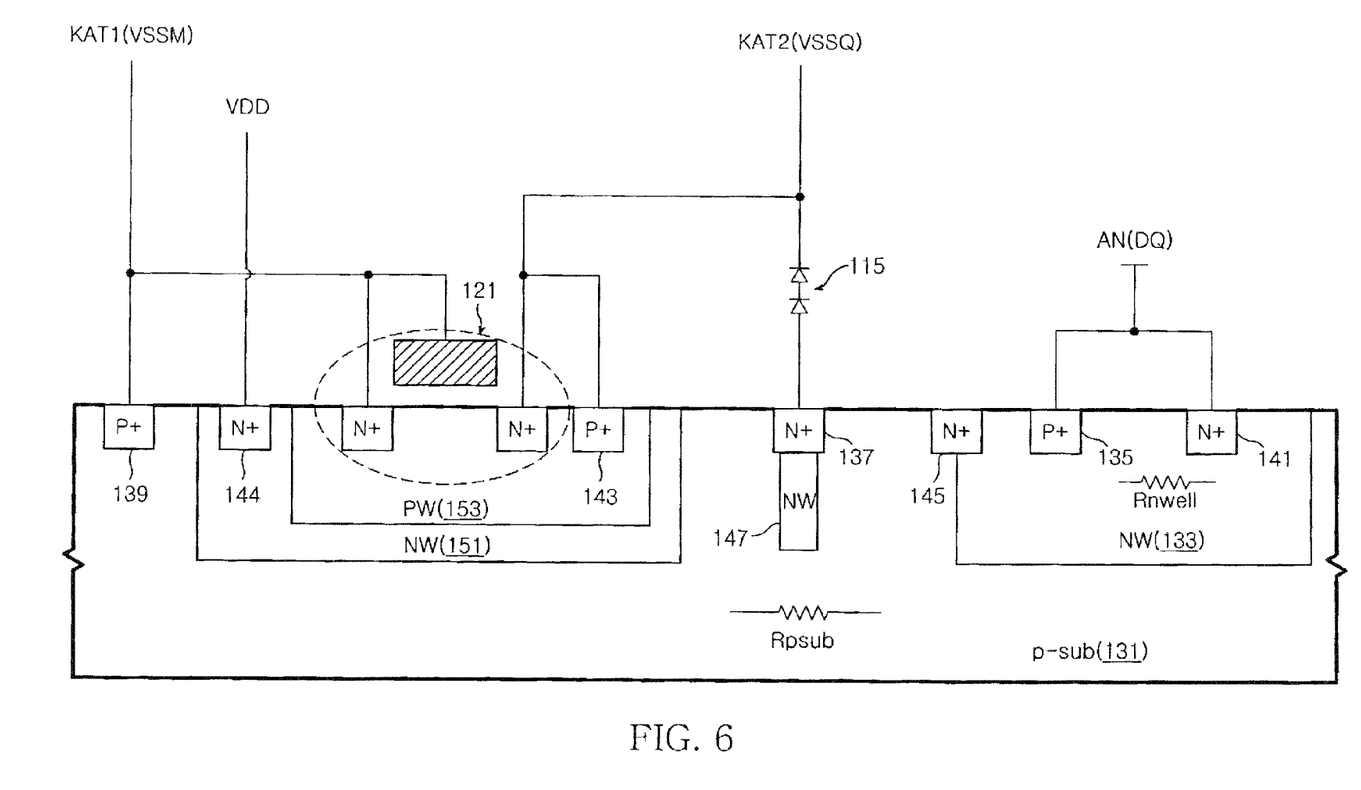
FIG. 6 is a sectional view showing the structure of the silicon-controlled rectifier of FIG. 4.

FIG. 6 is a sectional view showing the structure of the SCR of FIG. 4. Referring to FIG. 6, the SCR structure of the present invention is formed on a P-type substrate 131. Further, the SCR structure of the present invention includes a first N-well 133, a first P+ region 135, a first N+ region 141, a second N+ region 137, a second P+ region 139 and an isolation device 121.

The first N-well 133 is formed in the P-type substrate 131, and the first P+ region 135 and the first N+ region 141 are arranged in the first N-well 133. Further, the second N+ region 137 and the second P+ region 139 are formed in the P-type substrate 131.

In this case, the voltage of the anode AN, connected to the signal line DQ, is applied both to the first P+ region 135 and to the first N+ region 141. The voltage of the first cathode KAT1, connected to the main ground voltage line VSSM, is applied to the second P+ region 139. The voltage of the second cathode KAT2, connected to the peripheral ground voltage line VSSQ, is applied to the second N+ region 137.

The isolation device 121 electrically isolates the first cathode KAT1 from the second cathode KAT2. Preferably, the isolation device 121 includes an N-channel transistor 121, one junction and a gate terminal of which are connected to the first cathode KAT1, and the other junction of which is connected to the second cathode KAT2. The N-channel transistor 121 is implemented in a channel P-well 153 that is included in a N-channel well 151. That is, the N-channel transistor 121 is implemented in a triple well.

Preferably, the SCR structure of the present invention further includes a third P+ region 143 and a fourth N+ region 144. The third P+ region 143 is formed in channel P-well 153. In addition, in this embodiment, the voltage of the second cathode KAT2 is applied to the third P+ region 143. And, a power voltage is applied to the fourth N+ region 144.

As described above, the isolation device 121 is implemented in the triple well, so that, in the SCR according to the present invention, the stability of the voltage of the main ground voltage line VSSM is further improved.

Preferably, the SCR structure of the present invention further includes a third N+ region 145. The third N+ region 145 is formed in both the first N-well 133 and the P-type substrate 131.

As can be seen by comparing the circuit diagram of FIG. 4 with the sectional view of FIG. 6, the PNP transistor 111 is formed by the first P+ region 135, the first N-well 133 and the P-type substrate 131. In addition, the NPN transistor 113 is formed by the first N-well 133, the P-type substrate 131 and the second N+ region 137. The zener diode 117 of FIG. 4 is formed by the P-type substrate 131 and the third N+ region 145.

In FIG. 6, the SCR structure preferably further includes a second N-well 147. The second N-well 147 is formed below the second N+ region 137. With the second N-well 147, the resistance Rpsub of the P-type substrate 131 between the first N-well 133 and the first P+ region 139 increases.

As described above, an increase in the resistance Rpsub of the P-type substrate 131 between the first N-well 133 and the first P+ region 139 means that the voltage of the base terminal N114 of the NPN transistor 113 of FIG. 4 increases. Therefore, when ESD occurs, the NPN transistor 113 is more easily turned on, which permits a large amount of current to flow from the anode AN into the second cathode KAT2. As a result, the IC is more readily protected when ESD occurs.

For reference, in FIGS. 4 and 6, reference character Rpsub is indicated by a resistance element existing between the N-well 133 and the P+ region 139. Reference character Rnwell is indicated by a resistance element existing in the N-well 133 between the N+ region 141 and the P-type substrate 131.

The SCR according to the present invention includes the isolation device. Further, the isolation device, isolates the main ground voltage line, which is connected to the first cathode, from the peripheral ground voltage line, which connected to the second cathode. Therefore, in the SCR according to the present invention, even if noise occurs on the peripheral ground voltage line during the operation of an IC, the main ground voltage line maintains a stable voltage level.

Although preferred embodiments of the present invention have been disclosed for illustrative purposes, those skilled in the art will appreciate that various modifications, additions and substitutions are possible, without departing from the scope and spirit of the invention as described in the accompanying claims.

For example, in the present specification, only the embodiment of an SCR structure formed on a P-type substrate is shown and described. However, it is apparent to those skilled in the art that the technical spirit of the present invention can be realized by an embodiment in which an SCR structure is formed on an N-type substrate.

The components of FIG. 6 are inclusively described in the claims of the present specification. It should be noted that the P-type substrate 131 is referred to herein as a 'first conduction-type low density substrate', the first N-well 133 is referred to herein as a 'second conduction-type first low density well', the first P+ region 135 is referred to herein as a 'first conduction-type first high density region', the first N+ region 141 is referred to herein as a 'second conduction-type second high density region', the second N+ region 137 is referred to herein as a 'second conduction-type third high density region', and the second P+ region 139 is referred to herein as a 'first conduction-type fourth high density region'.

Finally, the scope of the present invention is defined by the accompanying claims.

What is claimed is:

1. An electrostatic discharge protection circuit with silicon-controlled rectifier characteristics for protecting an integrated circuit from damage by electrostatic discharge, the circuit comprising:
    an anode connected to the integrated circuit;
    a first cathode connected to a main ground line;
    a second cathode connected to a peripheral ground line;
    a PNP transistor disposed between the anode and the first cathode;
    an NPN transistor disposed between the anode and the second cathode; and
    an isolation device for electrically isolating the first cathode from the second cathode,
    wherein the isolation device comprises a transistor, a first junction and a gate terminal of which are connected to the first cathode, and a second junction of which is connected to the second cathode.

2. The circuit according to claim 1, wherein the isolation device is operative to isolate the first cathode from the second cathode when a difference between voltages of the first and second cathodes is within a predetermined range.

3. The circuit according to claim 1, wherein the transistor of the isolation device is an N-channel transistor.

4. The circuit according to claim 1, wherein a base of the PNP transistor and a collector of the NPN transistor are connected in common, and a base of the NPN transistor and a collector of the PNP transistor are connected in common.

5. The circuit according to claim 1, further comprising a diode stack unit disposed between the second cathode and an emitter of the NPN transistor.

6. The circuit of claim 1 wherein said transistors each include an emitter and wherein said circuit further comprises a diode disposed between the emitters.

7. An electrostatic discharge protection circuit with silicon-controlled rectifier characteristics for protecting an integrated circuit from damage by electrostatic discharge, the circuit comprising:
    a first N-well formed in a P-type substrate;
    a first P+ region and a first N+ region arranged in the first N-well;
    a second N+ region formed in the P-type substrate;
    a second P+ region formed in the P-type substrate; and
    an isolation device for electrically isolating a first cathode from a second cathode,
    wherein the first P+ region and the first N+ region are connected to the integrated circuit, the second P+ region is connected to a main ground, and the second N+ region is connected to a peripheral ground,
    wherein the isolation device comprises a transistor, a first junction and a gate terminal of which are connected to the first cathode, and a second function of which is connected to the second cathode.

8. The circuit of claim 7, further comprising a third N+ region arranged both in the first N-well and in the P-type substrate.

9. The circuit of claim 7, wherein the isolation device electrically isolates the first cathode from the second cathode when a difference between voltages of the first and second cathodes is within a predetermined range.

10. The circuit of claim 7, wherein the transistor of the isolation device is an N-channel transistor.

11. The circuit of claim 9, wherein the N-channel transistor is implemented in a channel P-well included in a channel N-well.

12. The circuit of claim 6, further comprising a diode stack unit formed between the second cathode and the second N+ region.

13. The circuit of claim 6, further comprising a second N-well formed below the second N+ region to increase resistance between the first N-well and the first P+ region.

14. An electrostatic discharge protection circuit with silicon-controlled rectifier characteristics for protecting an integrated circuit from damage by electrostatic discharge, the circuit being of the type having an NPN transistor and a PNP transistor connected to an anode, the circuit comprising:
    a first cathode comprising a first-conductivity type substrate;
    a second-conductivity type well formed in the substrate; and a second cathode comprising a first-conductivity-type well formed in the second-conductivity type well; and an isolation device formed in the first-conductivity type well, wherein the isolation device is connected to the first and second cathodes.

15. The circuit of claim 14 wherein the first cathode is connected to a main ground and the second cathode is connected to a peripheral ground.

16. The circuit of claim 14 wherein the isolation device is constructed and arranged to isolate the first and second cathodes from one another when the voltage difference between the cathodes is within a predetermined range.

17. The circuit of claim 14 wherein said isolation device comprises a transistor having a second-conductivity type channel.

18. The circuit of claim 14 wherein said first-conductivity type is doped with a p-type dopant and said second-conductivity type is doped with an n-type dopant.

19. The circuit of claim 14 wherein said transistors are constructed and arranged to operate in a latched mode.

* * * * *